(12) United States Patent
Okutsu et al.

(10) Patent No.: US 11,346,898 B2
(45) Date of Patent: May 31, 2022

(54) MAGNETIC SENSOR MODULE AND IC CHIP EMPLOYED IN SAME

(71) Applicants: Asahi Kasei Microdevices Corporation, Tokyo (JP); TDK Corporation, Tokyo (JP)

(72) Inventors: Yoshitaka Okutsu, Tokyo (JP); Masanori Yoshida, Tokyo (JP); Kazuhiro Ishida, Tokyo (JP); Kazuya Watanabe, Tokyo (JP); Hiraku Hirabayashi, Tokyo (JP); Masanori Sakai, Tokyo (JP)

(73) Assignees: Asahi Kasei Microdevices Corporation, Tokyo (JP); TDK Corporation, Tokyo (JP)

(*) Notice: Subject to any disclaimer, the term of this patent is extended or adjusted under 35 U.S.C. 154(b) by 30 days.

(21) Appl. No.: 16/912,714

(22) Filed: Jun. 26, 2020

(65) Prior Publication Data

US 2020/0326390 A1 Oct. 15, 2020

Related U.S. Application Data

(63) Continuation of application No. PCT/JP2018/047967, filed on Dec. 26, 2018.

(30) Foreign Application Priority Data

Dec. 27, 2017 (JP) .............................. JP2017-250642

(51) Int. Cl.
  *G01R 33/09* (2006.01)
  *G01D 5/20* (2006.01)
  *G01R 33/00* (2006.01)

(52) U.S. Cl.
  CPC ........... *G01R 33/09* (2013.01); *G01D 5/2006* (2013.01); *G01R 33/0052* (2013.01)

(58) Field of Classification Search
  CPC ... G01R 33/09; G01R 33/0052; G01D 5/2006
  See application file for complete search history.

(56) References Cited

U.S. PATENT DOCUMENTS

| 4,801,883 A | 1/1989 | Muller |
| 7,187,167 B2 * | 3/2007 | Sato ...................... H01F 41/302 324/244 |

(Continued)

FOREIGN PATENT DOCUMENTS

| EP | 1336858 A2 | 8/2003 |
| JP | 2001221838 A | 8/2001 |

(Continued)

OTHER PUBLICATIONS

International Search Report and (ISA/237) Written Opinion of the International Search Authority for International Patent Application No. PCT/JP2018/047967, dated by the Japan Patent Office Mar. 5, 2019.

(Continued)

*Primary Examiner* — Reena Aurora

(57) ABSTRACT

An object is to provide a magnetic sensor module that suppresses a size of a magnetic sensor chip while applying a uniform calibration magnetic field to a magneto-resistive element. Provided is a magnetic sensor module comprising an IC chip having a first coil; and a magnetic sensor chip that is disposed on a surface of the IC chip and includes a first magnetic sensor that detects magnetism in a direction of first axis, wherein a planar shape of the IC chip encompasses a planar shape of the magnetic sensor chip, and the first coil has a planar shape including three or more sides, and is, when seen in a cross section along at least one side of the planar shape, is formed so as to cover a region, in a direction of the one side, of the first magnetic sensor.

23 Claims, 14 Drawing Sheets

(56) References Cited

U.S. PATENT DOCUMENTS

| | | | |
|---|---|---|---|
| 9,846,205 B1 | 12/2017 | Sonntag | |
| 10,145,908 B2 | 12/2018 | David | |
| 10,845,215 B2 * | 11/2020 | Kluge | G01B 7/003 |
| 2003/0094944 A1 | 5/2003 | Suzuki | |
| 2003/0155913 A1 | 8/2003 | Honkura | |
| 2005/0122100 A1 | 6/2005 | Wan | |
| 2007/0187820 A1 | 8/2007 | Takano | |
| 2007/0205748 A1 | 9/2007 | Abou | |
| 2009/0108841 A1 | 4/2009 | Abe | |
| 2010/0117638 A1 | 5/2010 | Yamashita | |
| 2012/0016614 A1 | 1/2012 | Hohe | |
| 2015/0028857 A1 | 1/2015 | Hachida | |
| 2015/0316638 A1 | 11/2015 | Yamashita | |
| 2018/0340986 A1 * | 11/2018 | Latham | G01D 5/14 |
| 2020/0241083 A1 * | 7/2020 | Franke | H01F 5/04 |
| 2020/0326390 A1 * | 10/2020 | Okutsu | G01R 33/09 |

FOREIGN PATENT DOCUMENTS

| | | |
|---|---|---|
| JP | 2006003116 A | 1/2006 |
| JP | 2007026807 A | 2/2007 |
| JP | 2007292692 A | 11/2007 |
| JP | 2009180608 A | 8/2009 |
| JP | 2009186405 A | 8/2009 |
| JP | 2016017830 A | 2/2016 |
| JP | 2017072375 A | 4/2017 |
| JP | 2017096627 A | 6/2017 |

OTHER PUBLICATIONS

Notice of First Office Action for Patent Application No. 201880084087.1, issued by The National Intellectual Property Administration of the People's Republic of China dated Jan. 5, 2022.

Zhang Li, "Research on the structure and properties of magnetoresistive effect sensor materials" (China Outstanding Master's Degree Thesis Full Text Database (Electronic Journal) Information Science and Technology Series), Sep. 15, 2015, pp. 1-25.

* cited by examiner

MAGNETIC SENSOR MODULE AND IC CHIP EMPLOYED IN SAME

The contents of the following Japanese patent application(s) are incorporated herein by reference:
NO. 2017-250642 filed in JP on Dec. 27, 2017, and
NO. PCT/JP2018/047967 filed on Dec. 26, 2018.

BACKGROUND

1. Technical Field

The present invention relates to a magnetic sensor module and an IC chip.

2. Related Art

In order to maintain accuracy of a magnetic sensor, it is preferably to calibrate sensitivity even during an operation. Therefore, known is a method of supplying constant current to a sensitivity adjusting coil embedded in a magnetic sensor chip to generate a known magnetic field, and measuring the same to adjust sensitivity of a magnetic sensor during an operation.

A first aspect of the present invention provides a magnetic sensor module comprising an IC chip having a first coil, and a magnetic sensor chip that is disposed on a surface of the IC chip and includes a first magnetic sensor that detects magnetism in a direction of first axis, wherein a planar shape of the IC chip encompasses a planar shape of the magnetic sensor chip, and the first coil has a planar shape including three or more sides, and, when seen in a cross section along at least one side of the planar shape, is formed so as to cover a region, in a direction of the one side, of the first magnetic sensor.

A second aspect of the present invention provides an IC chip comprising a surface on which a magnetic sensor chip having a first magnetic sensor that detects magnetism in a direction of first axis is disposed, and a first coil, wherein a planar shape of the IC chip encompasses a planar shape of the magnetic sensor chip, and the first coil has a planar shape including three or more sides, and, when seen in a cross section along at least one side of the planar shape, is formed so as to cover a region, in a direction of the one side, of the first magnetic sensor.

(General Disclosure)
(Item 1)
A magnetic sensor module may comprises an IC chip having a first coil. The magnetic sensor module may comprise a magnetic sensor chip that is disposed on a surface of the IC chip and includes a first magnetic sensor that detects magnetism in a direction of first axis. A planar shape of the IC chip may encompass a planar shape of the magnetic sensor chip. The first coil may have a planar shape including three or more sides.
(Item 2)
The first coil may be, when seen in a cross section along at least one side of the planar shape of the IC chip, formed so as to cover a region, in a direction of the one side, of the first magnetic sensor.
(Item 3)
The first coil may be, when seen in a cross section along at least one side of the planar shape of the IC chip, formed so as to cover a region, in a direction of the one side, of the magnetic sensor chip.
(Item 4)
A vertical projection line from at least one side of the planar shape of the first coil to the first magnetic sensor may traverse the first magnetic sensor in a direction different from the first axis.
(Item 5)
A vertical projection line from at least one side of the planar shape of the first coil to the magnetic sensor chip may traverse the magnetic sensor chip in a direction different from the first axis.
(Item 6)
The IC chip may include a second coil. The magnetic sensor chip may include a second magnetic sensor that detects magnetism in a direction of second axis different from the first axis. The second coil may have a planar shape including three or more sides.
(Item 7)
The second coil may be, when seen in a cross section along at least one side of the planar shape of the IC chip, formed so as to cover a region, in a direction of the one side, of the second magnetic sensor.
(Item 8)
The second coil may be, when seen in a cross section along at least one side of the planar shape of the IC chip, formed so as to cover a region, in a direction of the one side, of the magnetic sensor chip.
(Item 9)
A vertical projection line from at least one side of the planar shape of the second coil to the second magnetic sensor may traverse the second magnetic sensor in a direction different from the second axis.
(Item 10)
A vertical projection line from at least one side of the planar shape of the second coil to the magnetic sensor chip may traverse the magnetic sensor chip in a direction different from the second axis.
(Item 11)
A vertical projection line from at least one side of the planar shape of the first coil to the first magnetic sensor may traverse the first magnetic sensor in a direction different from the first axis and the second axis. The vertical projection line from the at least one side of the planar shape of the second coil to the second magnetic sensor may traverse the second magnetic sensor in a direction different from the first axis and the second axis.
(Item 12)
A vertical projection line from at least one side of the planar shape of the first coil to the magnetic sensor chip may traverse the magnetic sensor chip in a direction different from the first axis and the second axis. The vertical projection line from the at least one side of the planar shape of the second coil to the magnetic sensor chip may traverse the magnetic sensor chip in a direction different from the first axis and the second axis.
(Item 13)
The first coil and the second coil may be disposed so that a resultant magnetic field of a magnetic field generated from the first coil and a magnetic field generated from the second coil is generated in a direction parallel to the surface of the IC chip and different from the first axis and the second axis.
(Item 14)
The IC chip may include a third coil. The magnetic sensor chip may include a third magnetic sensor that detects magnetism in a direction of third axis orthogonal to the first axis and the second axis. The third coil may have a planar shape including three or more sides. A vertical projection of the third coil to the magnetic sensor chip may include an entire region of the third magnetic sensor.

(Item 15)
The vertical projection of the third coil to the magnetic sensor chip may include an entire region of the magnetic sensor chip.
(Item 16)
The first magnetic sensor, the second magnetic sensor, and the third magnetic sensor may each include a magneto-resistive element configuring a Wheatstone bridge circuit.
(Item 17)
The first magnetic sensor and the second magnetic sensor may be disposed so as to overlap at least partially positions in a vertical direction in which magnetic fields generated by the first coil and the second coil are greatest.
(Item 18)
The first magnetic sensor and the second magnetic sensor may be disposed in positions in which the magnetic fields are greatest, in a direction passing a center of a line segment connecting a center of gravity of the first coil and a center of gravity of the second coil and perpendicular to the line segment.
(Item 19)
The magnetic sensor chip may include a pad connected to the first magnetic sensor, a pad connected to the second magnetic sensor, and a pad connected to the third magnetic sensor.
(Item 20)
An IC chip may comprise a surface on which a magnetic sensor chip including a first magnetic sensor that detects magnetism in a direction of first axis is disposed. The IC chip may comprise a first coil. A planar shape of the IC chip may encompass a planar shape of the magnetic sensor chip. The first coil may have a planar shape including three or more sides. The first coil may be, when seen in a cross section along at least one side of the planar shape, formed so as to cover a region, in a direction of the one side, of the first magnetic sensor.
(Item 21)
The first coil may be, when seen in a cross section along at least one side of the planar shape, formed so as to cover a region, in a direction of the one side, of the magnetic sensor chip.
(Item 22)
The IC chip may comprises a second coil. The magnetic sensor chip may include a second magnetic sensor that detects magnetism in a direction of second axis. The second coil may have a planar shape including three or more sides. The second coil may be, when seen in a cross section along at least one side of the planar shape, formed so as to cover a region, in a direction of the one side, of the second magnetic sensor.
(Item 23)
The second coil may be, when seen in a cross section along at least one side of the planar shape, formed so as to cover a region, in a direction of the one side, of the magnetic sensor chip.
(Item 24)
The IC chip may comprise a third coil. The magnetic sensor chip may include a third magnetic sensor that detects magnetism in a direction of third axis. The third coil may have a planar shape including three or more sides. A vertical projection of the third coil to the magnetic sensor chip may include an entire region of the third magnetic sensor.
(Item 25)
The vertical projection of the third coil to the magnetic sensor chip may include an entire region of the magnetic sensor chip.

DESCRIPTION OF EXEMPLARY EMBODIMENTS

Hereinafter, the present invention will be described through embodiments of the invention. However, the following embodiments do not limit the invention defined in the claims. Also, all combinations of features described in the embodiments are not necessarily essential to solutions of the invention.

Figure 1:
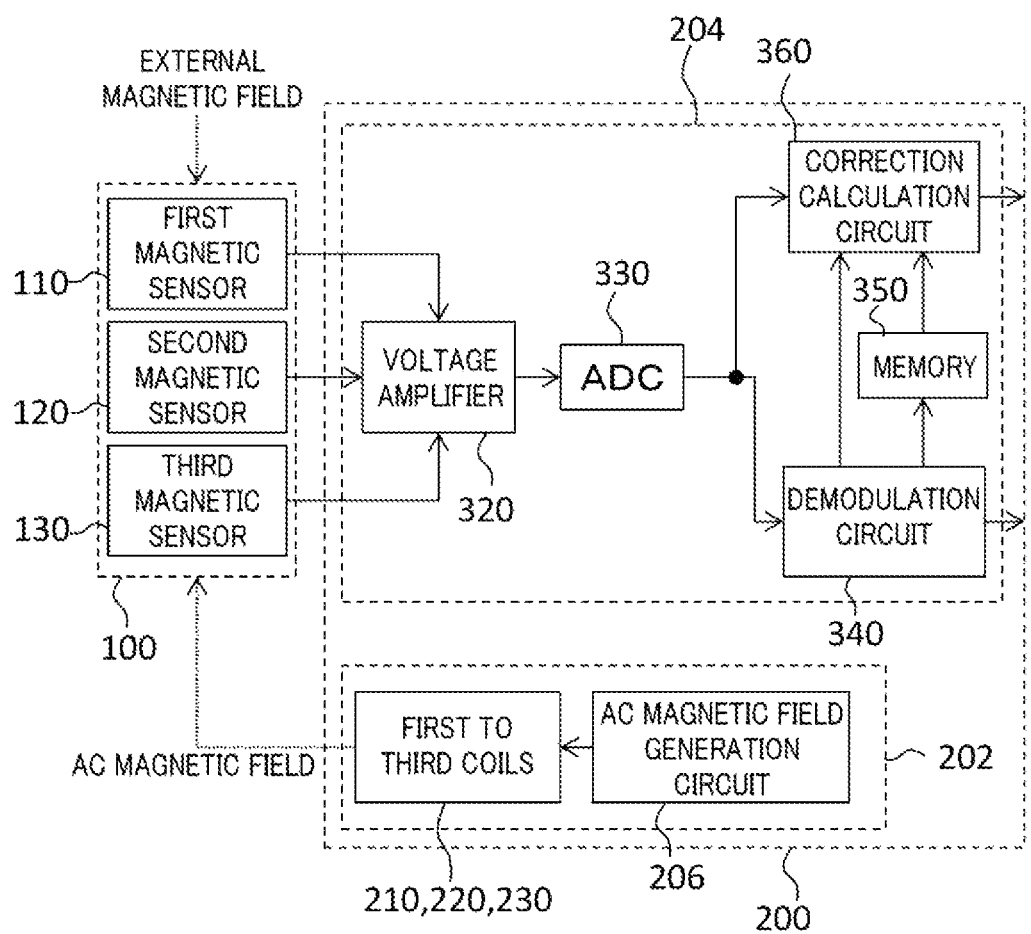
FIG. 1 is a block diagram for illustrating functions of a magnetic sensor module 10 of the present embodiment.

FIG. 1 is a block diagram for illustrating functions of a magnetic sensor module 10 of the present embodiment. The magnetic sensor module 10 in accordance with the present embodiment applies a uniform calibration magnetic field to a magnetic sensor by a coil embedded in an IC chip, thereby adjusting sensitivity of the magnetic sensor. The magnetic sensor module 10 comprises a magnetic sensor chip 100, and an IC chip 200.

The magnetic sensor chip 100 measures an external magnetic field. The magnetic sensor chip 100 may include one or more magnetic sensors, and detect magnetisms in one or more axial directions by the magnetic sensors. For example, the magnetic sensor chip 100 includes a first magnetic sensor 110, a second magnetic sensor 120, and a third magnetic sensor 130.

As an example, the first magnetic sensor 110 may detect magnetism in a direction of first axis, the second magnetic sensor 120 may detect magnetism in a direction of second axis different from the first axis, and the third magnetic sensor 130 may detect magnetism in a direction of third axis orthogonal to the first axis and the second axis. The first magnetic sensor 110, the second magnetic sensor 120, and the third magnetic sensor 130 output voltage signals corresponding to magnetism detection results to the IC chip 200.

The IC chip 200 processes signals from the magnetic sensor chip 100, and adjusts sensitivities of the magnetic sensors of the magnetic sensor chip 100. For example, the IC chip 200 comprises a sensitivity adjusting unit 202 that adjusts sensitivities of one or more magnetic sensors of the magnetic sensor chip 100, and a signal processing unit 204 that processes signals from the magnetic sensor chip 100.

The sensitivity adjusting unit 202 includes an AC magnetic field generation circuit 206, and one or more coils (for example, a first coil 210, a second coil 220, and a third coil 230) each provided in correspondence to each of one or more magnetic sensors of the magnetic sensor chip 100.

The AC magnetic field generation circuit 206 sequentially applies calibration current having different polarities to each of the coils. For example, the AC magnetic field generation circuit 206 applies AC calibration current to each of the first coil 210, the second coil 220, and the third coil 230, thereby causing the first coil 210, the second coil 220, and the third coil 230 to generate AC calibration magnetic fields. Thereby, each of the first magnetic sensor 110, the second magnetic sensor 120, and the third magnetic sensor 130 detects each of the AC calibration magnetic fields, and outputs an AC voltage signal corresponding to a magnetism detection result to the signal processing unit 204.

As described later, the first coil 210 and the second coil 220 may be applied with common current, thereby generating the calibration magnetic fields at the same time. Alternatively, the first coil 210 and the second coil 220 may be applied independently with current, thereby generating independently the calibration magnetic fields.

The signal processing unit 204 includes a voltage amplifier 320, an AD converter 330, a demodulation circuit 340, a memory 350, and a correction calculation circuit 360.

The voltage amplifier 320 receives the voltage signals from each of the first magnetic sensor 110, the second magnetic sensor 120, and the third magnetic sensor 130, and amplifies and outputs the same to the AD converter 330.

The AD converter 330 converts analog outputs from the voltage amplifier 320 into digital values, and supplies the same to the demodulation circuit 340 and the correction calculation circuit 360.

The demodulation circuit 340 converts an AC signal into a DC signal, and supplies the converted signal to the correction calculation circuit 360. Thereby, the demodulation circuit 340 converts AC signals originating from the AC voltage signals output by the first magnetic sensor 110, the second magnetic sensor 120 and the third magnetic sensor 130 upon the sensitivity adjustment, into DC signals. Also, the demodulation circuit 340 stores the converted DC signals in the memory 350, as initial sensitivities, in an inspection process and the like before shipment.

The correction calculation circuit 360 corrects sensitivities of the magnetic sensors. For example, the correction calculation circuit 360 acquires, from the demodulation circuit 340, the DC signals originating from the AC voltage signals output by the first magnetic sensor 110, the second magnetic sensor 120 and the third magnetic sensor 130 upon the sensitivity adjustment, compares the DC signals with the initial sensitivities read out from the memory 350, and determines sensitivity correction amounts.

Subsequently, the correction calculation circuit 360 acquires, from the AD converter 330, DC signals originating from external magnetic fields, as external magnetic field signals, corrects the same based on the determined sensitivity correction amounts, and outputs final output signals to an outside, as an output after sensitivity correction. A specific processing flow of the sensitivity correction will be described later.

According to the present embodiment, the IC chip 200 causes the first coil 210 to the third coil 230 to generate AC (alternating current) calibration magnetic fields. Therefore, it is possible to adjust the sensitivities of the first magnetic sensor 110 to the third magnetic sensor 130 during an operation, without interfering with the external DC magnetic fields.

Figure 2:
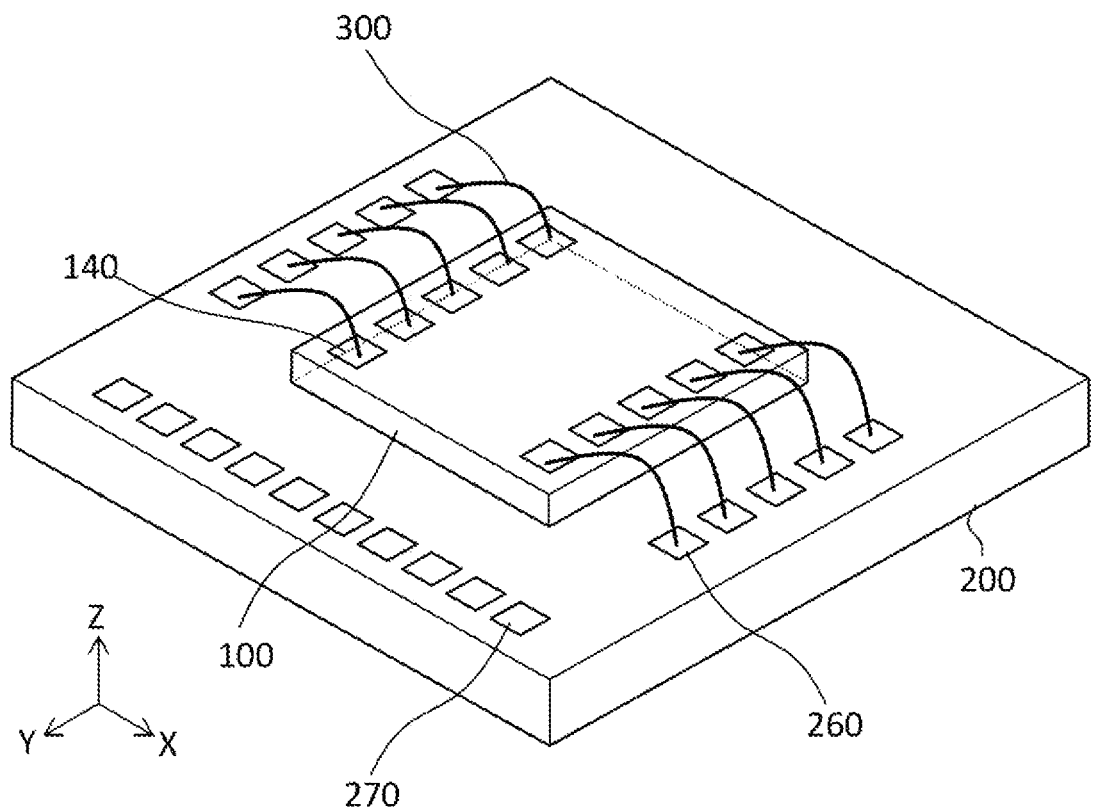
FIG. 2 is a schematic view of the magnetic sensor module 10 in accordance with the present embodiment.

FIG. 2 is a schematic view of the magnetic sensor module 10 in accordance with the present embodiment. In FIG. 2, directions of respective sides of the magnetic sensor chip 100 and the IC chip 200 are set as X and Y directions, and a thickness direction of the magnetic sensor chip 100 and the IC chip 200 is set as a Z direction. The magnetic sensor module 10 of the present embodiment may be mounted on another component such as a printed board and a lead frame.

As shown, the magnetic sensor chip 100 is disposed on a surface of the IC chip 200. Also, the magnetic sensor chip 100 has a plurality of (for example, 10) pads 140 on a first surface thereof. The first magnetic sensor 110, the second magnetic sensor 120, and the third magnetic sensor 130 embedded in the magnetic sensor chip 100 are connected to each of the pads 140, and are thus connected to the IC chip 200 via the pads 140.

The IC chip 200 has pads 260 and pads 270 on a first surface thereof. For example, the pads 260 may be disposed in the vicinity of the magnetic sensor chip 100, on the first surface of the IC chip 200. The IC chip 200 may have, for example, the 10 (ten) pads 260. For example, the IC chip 200 are connected to the ten pads 140 of the magnetic sensor chip 100 via the ten pads 260 and conductive wires 300. The conductive wire 300 may be formed by wire bonding.

The pads 270 are used for connection with an external printed board or the like on which the magnetic sensor module 10 is mounted. In this case, the pads 270 may be connected to the printed board or the like by wire bonding. For example, the IC chip 200 may have the ten pads 270, as shown.

As shown in FIG. 2, a planar shape (a shape on the XY plane) of the IC chip 200 is larger than a planar shape of the magnetic sensor chip 100, and encompasses the planar shape of the magnetic sensor chip 100. That is, a length of each side of the IC chip 200 on the plane is larger than a length of each side of the magnetic sensor chip 100.

Figure 3:
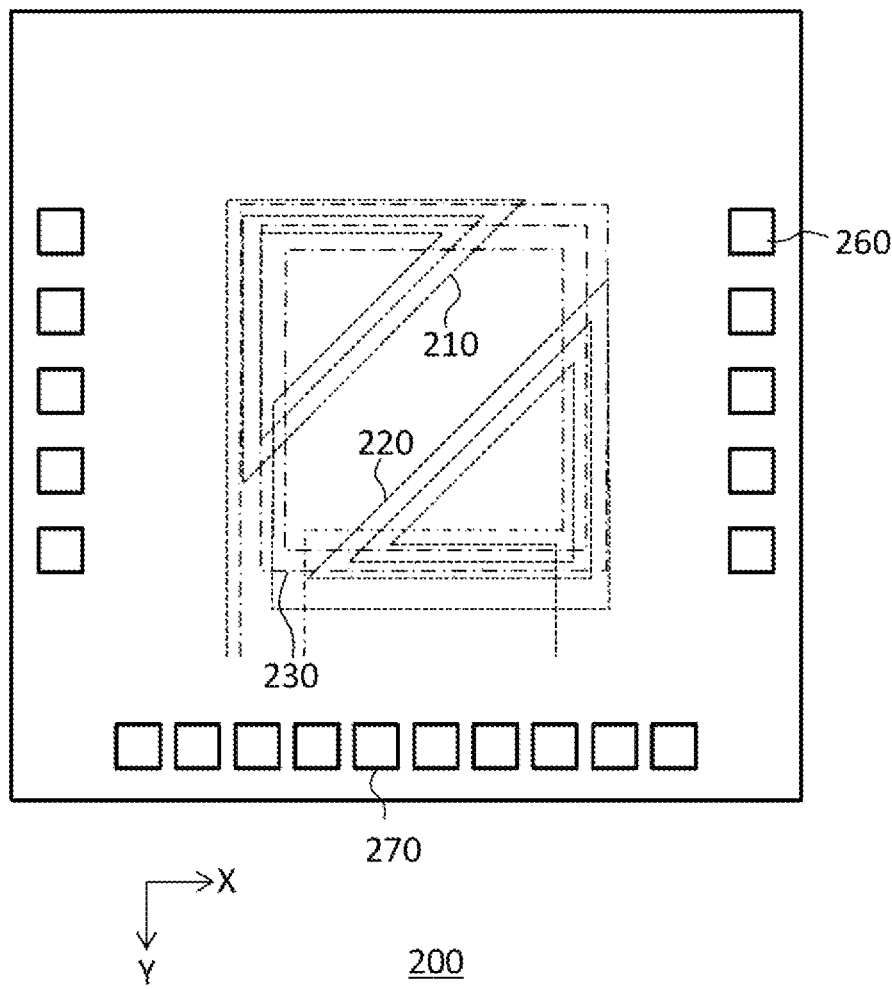
FIG. 3 is a plan view of an IC chip 200 in accordance with the present embodiment.

FIG. 3 is a plan view of the IC chip 200 seen from above in accordance with the present embodiment. In the meantime, when the first coil 210, the second coil 220, and the third coil 230 are disposed in the IC chip 200, they are invisible from above. However, in FIG. 2, positions of the coils on the XY plane are shown with broken lines. Herein, the first coil 210 and the second coil 220 are shown with the broken lines, and the third coil 230 is shown with the dashed-dotted line.

As shown, the first coil 210, the second coil 220, and the third coil 230 are provided in the IC chip 200 in the vicinity of a center thereof. As described later, the first coil 210 and the second coil 220, and the third coil 230 may be provided in different layers in the IC chip 200.

For example, the first coil 210 and the second coil 220 may be provided in an outermost metal layer of a plurality of metal layers embedded in the IC chip 200, and the third coil 230 may be provided in a metal layer below the outermost metal layer. In the meantime, the outermost metal layer may be provided on a surface of the IC chip 200, so that the first coil 210 and the second coil 220 may be exposed on the surface of the IC chip 200.

Figure 4:
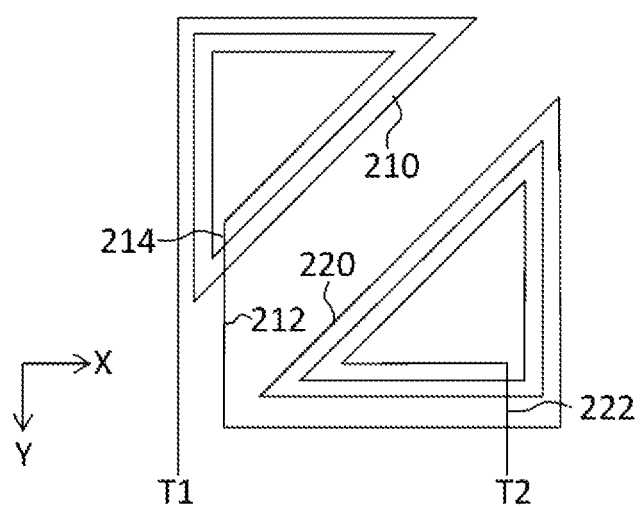
FIG. 4 is a plan view of a first coil 210 and a second coil 220 in accordance with the present embodiment.

FIG. 4 is a plan view of the first coil 210 and the second coil 220 in accordance with the present embodiment. The first coil 210 and the second coil 220 may each have a planar shape including three or more sides. For example, the first coil 210 and the second coil 220 may each have a triangular shape (as an example, an isosceles right triangle) as shown in FIG. 4.

Each of the first coil 210 and the second coil 220 may also be a spiral coil. The first coil 210 and the second coil 220 may be connected by a connection wire 212 such that directions of currents flowing through both the coils are opposite to each other.

For example, in FIG. 4, the current introduced from a terminal T1 on the left lower side may flow through the first coil 210 in a clockwise direction, flow through the second coil 220 in a counterclockwise direction, and flow out from a terminal T2 on the right lower side. As an example, one end T1 of the first coil 210 may be connected to a constant current source via a switch in the IC chip 200. Also, one end T2 of the second coil 220 may be connected to a ground pad (for example, one of the pads 270) via the switch in the IC chip 200.

The connection wire 212 may include an intersection portion 214 that intersects with the first coil 210. The intersection portion 214 may be provided in a metal layer (for example, the layer in which the third coil 230 is provided or yet another metal layer) different from the metal layer in which the first coil 210 is provided, and the first coil 210 and the intersection portion 214 may be interlayer connected by a via or the like. An intersection portion 222 that intersects with the second coil 220 may be provided between the second coil 220 and one end T2. The intersection portion 222 may be provided in a metal layer (for example, the layer in which the third coil 230 is provided or yet another metal layer) different from the metal layer in which the second coil 220 is provided, and the second coil 220 and the intersection portion 222 may be interlayer connected by a via or the like.

In the meantime, instead of the configuration shown in FIG. 4, the first coil 210 and the second coil 220 may not be connected to each other and may independently cause the current to flow therethrough. In this case, the first coil 210 and the second coil 220 may each have a similar terminal configuration to the third coil 230.

Figure 5:
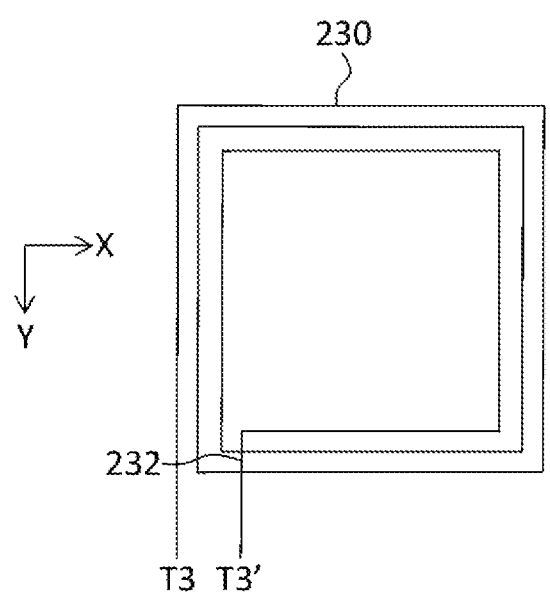
FIG. 5 is a plan view of a third coil 230 in accordance with the present embodiment.

FIG. 5 is a plan view of the third coil 230 in accordance with the present embodiment. The third coil 230 may have a planar shape including three or more sides. For example, the third coil 230 may have a rectangular shape (as an example, a square shape) as shown in FIG. 4.

The third coil 230 may be a spiral coil. For example, one end T3 of the third coil 230 may be connected to the ground pad (for example, one of the pads 270) via the switch in the IC chip 200. One end T3' of the third coil 230 may be connected to the constant current source via the switch in the IC chip 200.

An intersection portion 232 may be provided between the third coil 230 and one end T3'. The intersection portion 232 may be provided in a metal layer (for example, the metal layer in which the first coil 210 and the second coil 220 are provided or a layer further below the metal layer in which the third coil 230 is provided) different from the metal layer in which the third coil 230 is provided, and the third coil 230 and the intersection portion 232 may be interlayer connected by a via or the like.

Figure 6:
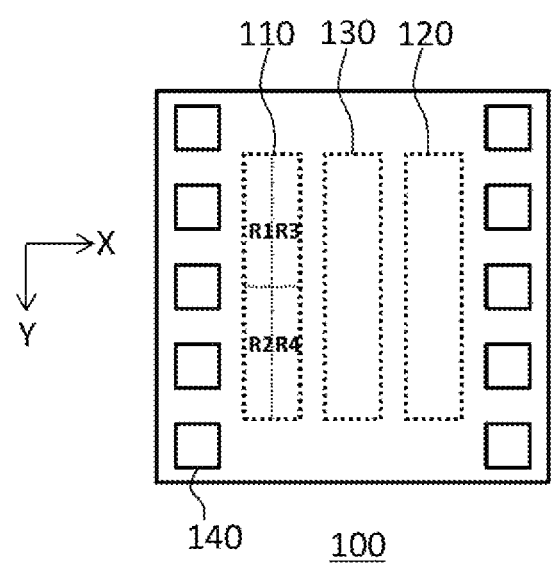
FIG. 6 is a plan view of a magnetic sensor chip 100 in accordance with the present embodiment.

FIG. 6 is a plan view of the magnetic sensor chip 100 in accordance with the present embodiment. In the meantime, the first magnetic sensor 110, the second magnetic sensor 120, and the third magnetic sensor 130 are disposed in the magnetic sensor chip 100 and are thus usually invisible from above. However, in FIG. 6, positions of the sensors are shown with broken lines. Instead, the first magnetic sensor 110 to the third magnetic sensor 130 may be exposed on the surface of the magnetic sensor chip 100.

As shown, the first magnetic sensor 110, the third magnetic sensor 130, and the second magnetic sensor 120 each have a rectangular shape extending in the Y direction, and are aligned in this order in the X direction. For example, the first magnetic sensor 110 may be an X-axis magnetic sensor having the X-axis as a magnetic sensing axis, the second magnetic sensor 120 may be a Y-axis magnetic sensor having the Y-axis as a magnetic sensing axis, and the third magnetic sensor 130 may be a Z-axis magnetic sensor having the Z-axis as a magnetic sensing axis. In this case, the Z-axis magnetic sensor is disposed in a central part of the magnetic sensor chip 100.

Herein, the first magnetic sensor 110 and the second magnetic sensor 120 may be sensitivity-adjusted by the calibration magnetic fields from the first coil 210 and the second coil 220. Also, the third magnetic sensor 130 may be sensitivity-adjusted by the calibration magnetic field from the third coil 230.

Each of the first magnetic sensor 110, the second magnetic sensor 120, and the third magnetic sensor 130 (hereinafter, also collectively referred to as "first magnetic sensor 110 and the like") may include a magneto-resistive element configuring a Wheatstone bridge circuit. For example, each of the first magnetic sensor 110 and the like may be a magneto-resistive element including a region R1, a region R2, a region R3, and a region R4 divided along the X direction and the Y direction. Each of the first magnetic sensor 110 and the like may be connected to terminals at each of a boundary between the region R1 and the region R2, a boundary between the region R1 and the region R3, a boundary between the region R2 and the region R4, and a boundary between the region R3 and the region R4.

Figure 7:
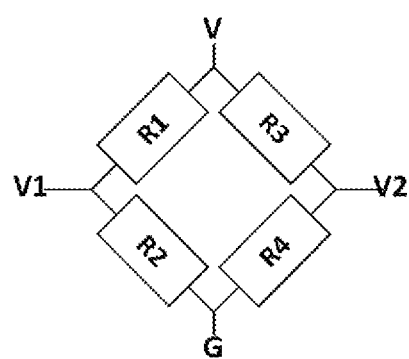
FIG. 7 shows an example of an equivalent circuit of a first magnetic sensor 110 and the like in accordance with the present embodiment.

FIG. 7 shows an example of an equivalent circuit of each of the first magnetic sensor 110 and the like configuring a Wheatstone bridge circuit, in accordance with the present embodiment. The resistor R1 to the resistor R4 in FIG. 7 correspond to the regions R1 to R4 in FIG. 6. As shown, in each of the first magnetic sensor 110 and the like, one end of the resistor R1, one end of the resistor R3 and a power supply terminal are connected, and the power supply terminal is connected to a constant voltage source, so that a voltage V is applied to the power supply terminal. The other end of the resistor R1, one end of the resistor R2 and a positive electrode output terminal are connected, so that an output voltage V1 is output from the positive electrode output terminal. The other end of the resistor R3, one end of the resistor R4 and a negative electrode output terminal are connected, so that an output voltage V2 is output from the negative electrode output terminal. The other end of the resistor R2, the other end of the resistor R4 and a ground terminal are connected, and the ground terminal is connected to a ground G.

Each of the first magnetic sensor 110 and the like outputs a difference between the output voltages V1 and V2, as a sensor output. The ground terminals of the first magnetic sensor 110 and the like may be connected with a wire layer in the magnetic sensor chip 100.

Herein, when resistance values of the region R1 to the region R4 upon applying of a positive magnetic field are denoted as $R_{1+}$ to $R_{4+}$, and resistance values upon applying of a negative magnetic field are denoted as $R_{1-}$ to $R_{4-}$, the resistance value of each region upon the sensitivity adjustment is expressed by following equations.

$$R_{1\pm}=R_0-(B_{off}\pm\Delta B_1)\times\alpha$$

$$R_{2\pm}=R_0-(B_{off}\pm\Delta B_2)\times\alpha$$

$$R_{3\pm}=R_0-(B_{off}\pm\Delta B_3)\times\alpha$$

$$R_{4\pm}=R_0-(B_{off}+\Delta B_4)\times\alpha$$

Herein, $R_0$ indicates a resistance value ($\Omega$) at the time of a zero magnetic field, $B_{off}$ indicates an offset magnetic field ($\mu T$) of an external magnetic field and the like, $\alpha$ indicates a magnetic sensitivity ($\Omega/\mu T$), and $\Delta B_1$ to $\Delta B_4$ indicate magnetic fields ($\mu T$) that are applied to each of the regions by the first coil 210 and the like.

Herein, when an output of the first magnetic sensor 110 and the like measured when applying the positive magnetic field in the first coil 210 and the like is denoted as $\Delta V_+$ and an output of the first magnetic sensor 110 and the like measured when applying the negative magnetic field is denoted as $\Delta V_-$, the sensitivity of the first magnetic sensor 110 and the like is expressed by $\frac{1}{2}(\Delta V_+ - \Delta V_-)$ in a following equation.

$$\frac{1}{2}(\Delta V_+ - \Delta V_-) \cong \left( \frac{R_0(\Delta B_1 + \Delta B_2 + \Delta B_3 + \Delta B_4)a +}{4R_0} \right) V \quad \text{[equation 1]}$$

(in the case of $4R_0^2 \gg ((\Delta B1 - \Delta B2)\times a)^2$, $4R_0^2 \propto ((\Delta B3 - \Delta B4)\times a)^2$)

As can be clearly seen from the equation, when the magnetic fields $\Delta B_1$ to $\Delta B_4$ applied to the region R1 to the region R4 are not uniform, the term $(\Delta B_1-\Delta B_2+\Delta B_3-\Delta B_4)$ is not zero, so that the external magnetic field $B_{off}$ existing upon the sensitivity adjustment influences the sensitivity measurement. Therefore, in order to perform the more accurate sensitivity adjustment, it is necessary for the magnetic sensor module 10 to apply the uniform magnetic field to the entire first magnetic sensor 110 and the like (i.e., the region R1 to the region R4) by the first coil 210 and the like.

Figure 8:
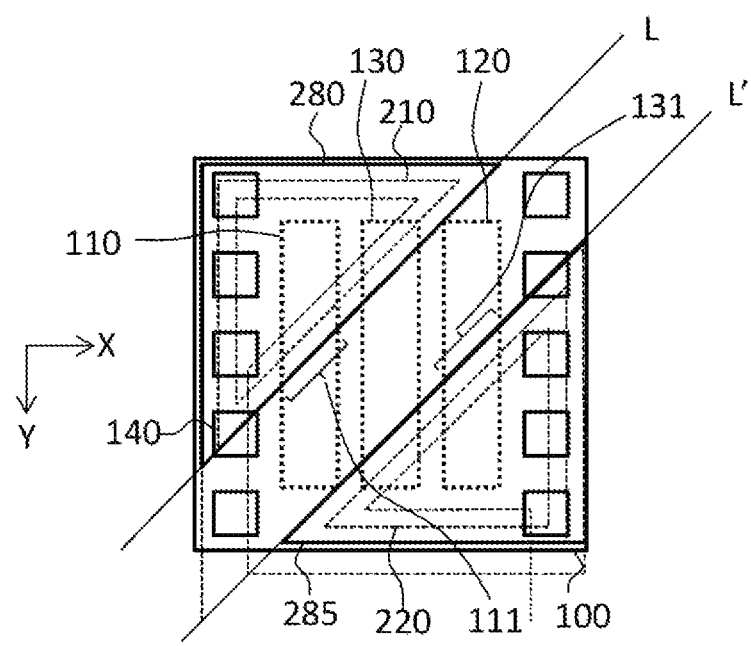
FIG. 8 is a plan view showing arrangement of the magnetic sensor chip 100, the first coil 210 and the second coil 220 in accordance with the present embodiment.

FIG. 8 is a plan view showing arrangement of the magnetic sensor chip 100, the first coil 210 and the second coil 220 in accordance with the present embodiment. In FIG. 8, the positions of the first coil 210 and the second coil 220 are overlapped with the magnetic sensor chip 100 shown in FIG. 6 to show a positional relation thereof on the XY plane. A first coil region 280 shows an outer shape (i.e., a triangular shape) region of the first coil 210, and a second coil region 285 shows an outer shape (i.e., a triangular shape) region of the second coil 220.

In the present embodiment, the first coil and the second coil may be disposed so that a resultant magnetic field of the magnetic field generated from the first coil 210 and the magnetic field generated from the second coil 220 is generated in a direction parallel to the surface of the IC chip 200 and different from the X-axis (first axis) and the Y-axis (second axis). For example, the resultant magnetic field may be an intermediate direction between the X-axis and the Y-axis, and may be, as an example, a direction parallel to a straight line L or a direction perpendicular to the straight line L on the XY plane. The first coil 210 and the second coil 220 may also be disposed inside of the magnetic sensor chip 100, as seen from above. The first coil 210 may be disposed so that a right angle portion of the isosceles right triangle corresponds to a corner of the magnetic sensor chip 100, and the second coil 220 may be disposed so that a right angle portion of the isosceles right triangle corresponds to another corner of the magnetic sensor chip 100. The first coil 210 and the second coil 220 may be disposed so that long sides thereof face each other in parallel.

Herein, the first coil 210 is, when seen in a cross section along at least one side of the planar shape, formed so as to cover a region, in a direction of the one side, of the first magnetic sensor 110. For example, a vertical projection line from at least one side of the planar shape of the first coil 210 to the magnetic sensor chip 100 traverses the first magnetic sensor 110 in a direction (for example, an intermediate direction between the X-axis and the Y-axis) different from the X-axis (first axis) and the Y-axis (second axis). As an example, a vertical projection line from a long side (a side overlapping the straight line L) of the triangular first coil 210 to the magnetic sensor chip 100 completely traverses the first magnetic sensor 110. Thereby, the long side of the first coil 210 covers a region 111, in a direction of the long side, of the first magnetic sensor 110. Thereby, the first coil 210 can apply the more uniform magnetic field to the entire region of the first magnetic sensor 110.

Likewise, the second coil 220 is, when seen in a cross section along at least one side of the planar shape, formed so as to cover a region, in a direction of the one side, of the second magnetic sensor 120. For example, a vertical projection line from at least one side of the planar shape of the second coil 220 to the magnetic sensor chip 100 traverses the second magnetic sensor 120 in a direction (for example, an intermediate direction between the X-axis and the Y-axis) different from the X-axis (first axis) and the Y-axis (second axis). As an example, a vertical projection line from a long side (a side overlapping the straight line L') of the triangular second coil 220 to the magnetic sensor chip 100 completely traverses the second magnetic sensor 120. Thereby, the long side of the second coil 220 covers a region 131, in a direction of the long side, of the second magnetic sensor 120. Thereby, the second coil 220 can apply the more uniform magnetic field to the entire region of the second magnetic sensor 120.

Figure 9:
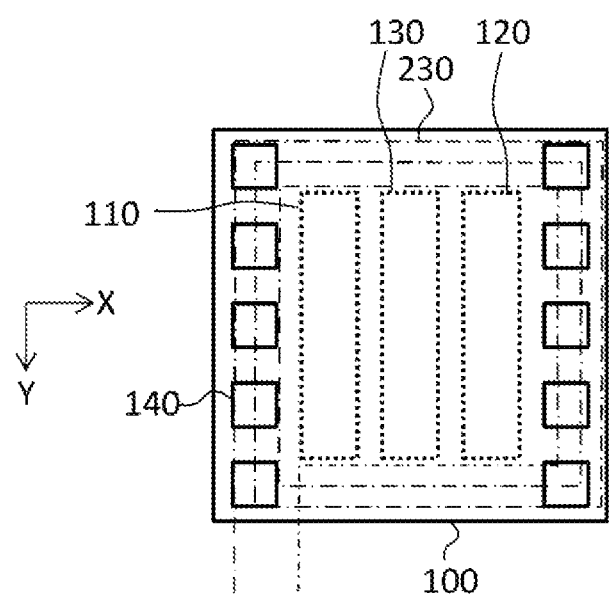
FIG. 9 is a plan view showing arrangement of the magnetic sensor chip 100 and a third coil 230 in accordance with the present embodiment.

FIG. 9 is a plan view showing arrangement of the magnetic sensor chip 100 and the third coil 230 in accordance with the present embodiment. In FIG. 9, the position of the third coil 230 is overlapped with the magnetic sensor chip 100 shown in FIG. 6 to show a positional relation thereof on the XY plane.

In the present embodiment, the third coil 230 may be disposed inside of the magnetic sensor chip 100, as seen from above. The third coil 230 may also be disposed so that each corner of the rectangle corresponds to each corner of the rectangular magnetic sensor chip 100. For example, the magnetic sensor chip 100 may be disposed so that a center of gravity of the magnetic sensor chip 100 coincides or substantially coincides with a center of gravity of the third coil 230, as seen from above.

In the present embodiment, a vertical projection of the third coil 230 to the magnetic sensor chip 100 includes an entire region of the third magnetic sensor 130. That is, as seen from above, the rectangle defining an outer shape of the third coil 230 completely encompasses an outer shape of the third magnetic sensor 130. Thereby, the third coil 230 can apply the more uniform magnetic field to the entire region of the third magnetic sensor 130. Also, the third coil 230 may be disposed so as to include the entire regions of the first magnetic sensor 110 and the second magnetic sensor 120.

Figure 10:
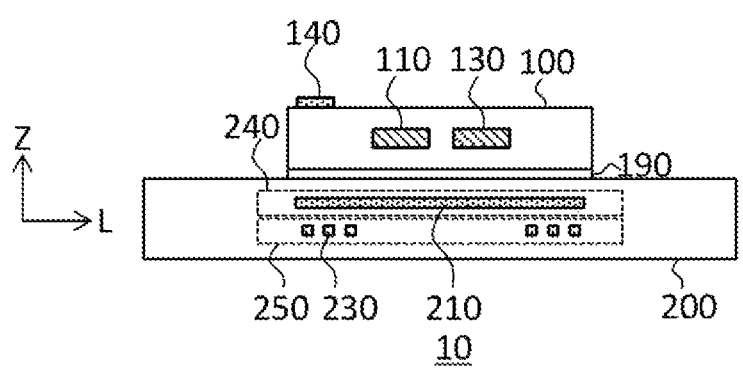
FIG. 10 is a vertical sectional view of the magnetic sensor module 10 taken along a straight line L in FIG. 8.
Figure 11:
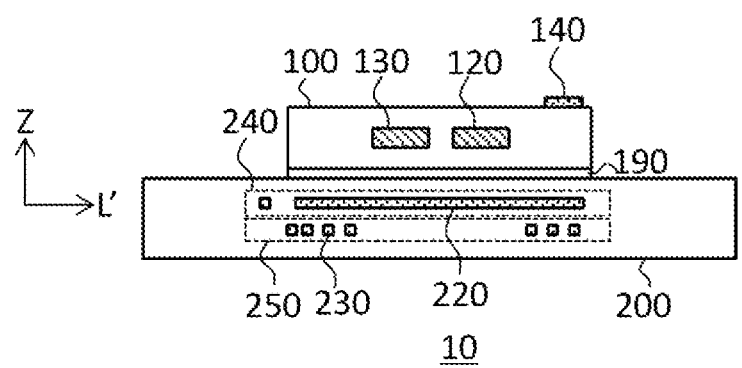
FIG. 11 is a vertical sectional view of the magnetic sensor module 10 taken along a straight line L' in FIG. 8.

FIG. 10 is a vertical sectional view taken along the straight line L (FIG. 8) of the magnetic sensor module 10, and FIG. 11 is a vertical sectional view taken along the straight line L' (FIG. 8) of the magnetic sensor module 10. As shown, the magnetic sensor chip 100 and the IC chip 200 are bonded to each other by an adhesive layer 190. Also, the first coil 210 and the second coil 220 are formed in a first metal layer 240 that is the uppermost layer in the IC chip 200. The third coil 230 is formed in a second metal layer 250 that is a metal layer below the first metal layer 240 in the IC chip 200.

As shown in FIG. 10, the first coil 210 completely covers the region of the first magnetic sensor 110 on the straight line L. Also, as shown in FIG. 11, the second coil 220 completely covers the region of the second magnetic sensor 120 on the straight line L'.

The first magnetic sensor 110, the second magnetic sensor 120 and the third magnetic sensor 130 may also be each disposed in positions in which the magnetic fields generated from each of the first coil 210, the second coil 220 and the third coil 230 increase. For example, the first magnetic sensor 110 and the second magnetic sensor 120 may be disposed so as to overlap at least partially positions in a vertical direction (for example, the Z direction) in which the magnetic fields generated by the first coil 210 and the second coil 220 are greatest. Specifically, the first magnetic sensor 110 and the second magnetic sensor 120 may be disposed in positions in which magnetic fields generated by the first coil 210 and the second coil 220 are greatest, in a direction passing a center of a line segment connecting a center of gravity of the first coil 210 and a center of gravity of the second coil 220 and perpendicular to the line segment.

For example, the first magnetic sensor 110 and the second magnetic sensor 120 may be disposed so as to include a position of about ⅓ (for example, 110 to 120 μm) of a distance (as an example, 360 μm) of the line connecting the centers of gravity of the first coil 210 and the second coil 220. Also, the third magnetic sensor 130 may be disposed so as to overlap at least partially a position in a vertical direction (for example, the Z direction) in which the magnetic field generated by the third coil 230 is greatest.

Subsequently, a first modified embodiment of the present embodiment is described. In the first modified embodiment, the first coil 210, the second coil 220, and the third coil 230 may be disposed so as to cover the magnetic sensor chip 100.

Figure 12:
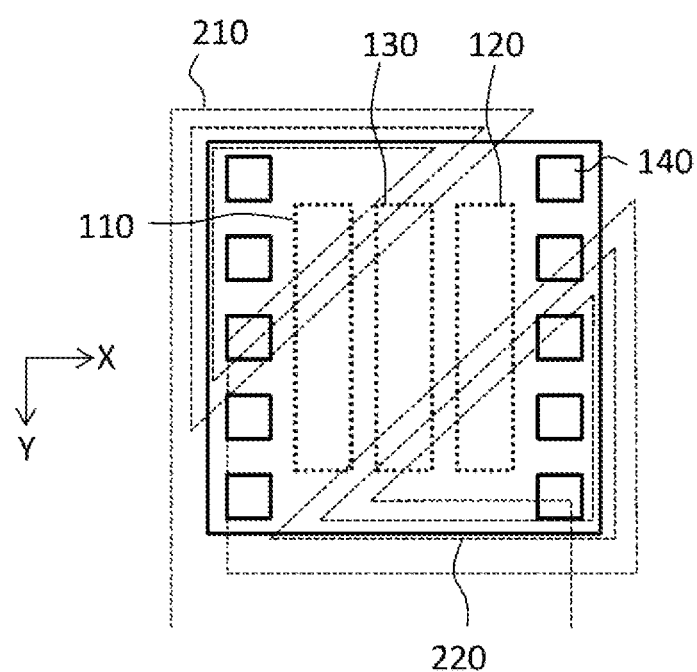
FIG. 12 is a plan view showing arrangement of the magnetic sensor chip 100, the first coil 210 and the second coil 220 in accordance with a first modified embodiment of the present embodiment.

FIG. 12 is a plan view showing arrangement of the magnetic sensor chip 100, the first coil 210 and the second coil 220 in accordance with the first modified embodiment of the present embodiment. In FIG. 12, the positions of the first coil 210 and the second coil 220 are overlapped with the magnetic sensor chip 100 to show a positional relation thereof on the XY plane.

In the present modified embodiment, portions of the first coil 210 and the second coil 220 are disposed outside of the magnetic sensor chip 100, as seen from above. The first coil 210 is disposed so that two short sides of the isosceles right triangle are positioned outside of the magnetic sensor chip 100 in parallel to the sides of the magnetic sensor chip 100.

In the present modified embodiment, the first coil 210 is, when seen in a cross section along at least one side of the triangle, formed so as to cover a region, in a direction of the one side, of the magnetic sensor chip 100. For example, a vertical projection line from at least one side of the planar shape of the first coil 210 to the magnetic sensor chip 100 traverses the magnetic sensor chip 100 in a direction (for example, an intermediate direction between the X-axis and the Y-axis) different from the X-axis (first axis) and the Y-axis (second axis). As an example, a vertical projection line from a long side of the triangular first coil 210 to the magnetic sensor chip 100 completely traverses the magnetic sensor chip 100. Thereby, the first coil 210 can apply the more uniform magnetic field to the entire region of the first magnetic sensor 110. In the present modified embodiment, the first coil and the second coil may be disposed so that a resultant magnetic field of the magnetic field generated from the first coil 210 and the magnetic field generated from the second coil 220 is generated in a direction parallel to the surface of the IC chip 200 and different from the X-axis (first axis) and the Y-axis (second axis). For example, the resultant magnetic field may be an intermediate direction between the X-axis and the Y-axis, and may be, as an example, a direction parallel to the straight line L or a direction perpendicular to the straight line L on the XY plane.

Also, in the present modified embodiment, the second coil 220 is, when seen in a cross section along at least one side of the triangle, formed so as to cover a region, in a direction of the one side, of the magnetic sensor chip 100. For example, a vertical projection line from at least one side of the planar shape of the second coil 220 to the magnetic sensor chip 100 traverses the magnetic sensor chip 100 in a direction (for example, an intermediate direction between the X-axis and the Y-axis) different from the X-axis (first axis) and the Y-axis (second axis). As an example, a vertical projection line from a long side of the triangular second coil 220 to the magnetic sensor chip 100 completely traverses the magnetic sensor chip 100. Thereby, the second coil 220 can apply the more uniform magnetic field to the entire region of the second magnetic sensor 120.

Figure 13:
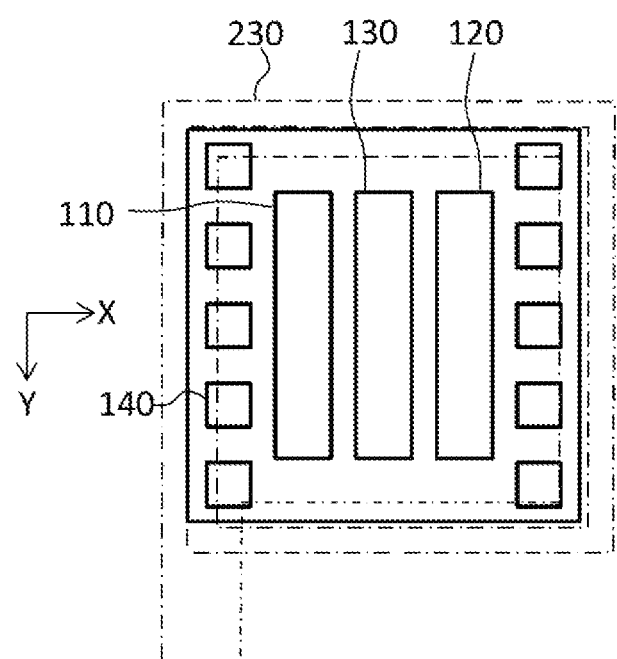
FIG. 13 is a plan view showing arrangement of the magnetic sensor chip 100 and the third coil 230 in accordance with the first modified embodiment.

FIG. 13 is a plan view showing arrangement of the magnetic sensor chip 100 and the third coil 230 in accordance with the first modified embodiment of the present embodiment. In FIG. 13, the position of the third coil 230 is overlapped with the magnetic sensor chip 100 to show a positional relation thereof on the XY plane.

In the present modified embodiment, an outer peripheral part of the third coil 230 may be disposed outside of the magnetic sensor chip 100, as seen from above. Thereby, a vertical projection of the third coil 230 to the magnetic sensor chip 100 includes an entire region of the magnetic sensor chip 100. For example, an outer shape of the rectangular third coil 230 completely encompasses an outer shape of the rectangular magnetic sensor chip 100. Also, for example, the magnetic sensor chip 100 may be disposed so that a center of gravity of the magnetic sensor chip 100 coincides or substantially coincides with a center of gravity of the third coil 230, as seen from above. Thereby, the third coil 230 can apply the more uniform magnetic field to the entire region of the third magnetic sensor 130.

Figure 14:
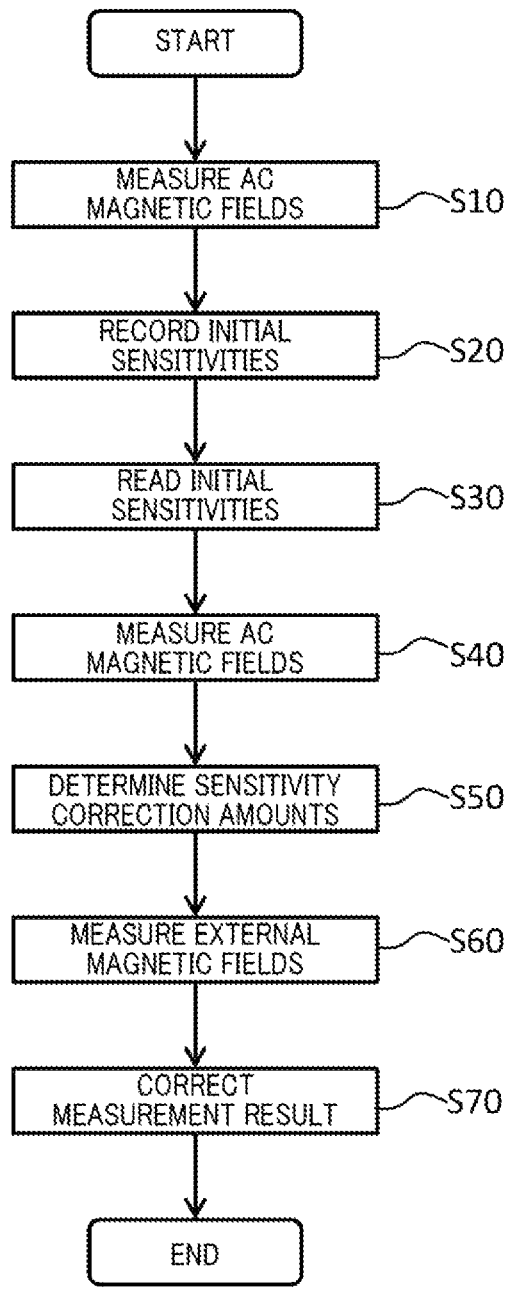
FIG. 14 shows an example of a processing flow of the magnetic sensor module 10 of the present embodiment.

FIG. 14 shows an example of a processing flow of the magnetic sensor module 10 of the present embodiment. The magnetic sensor module 10 can perform the accurate sensitivity correction during an operation by executing processing of S10 to S70 in FIG. 14.

Herein, the processing of S10 and S20 may be executed in an inspection process before shipment. The processing of S30 and thereafter may be executed at any timing after start of use of the magnetic sensor module 10. For example, the processing of S30 and thereafter may be executed at periodic timing or in response to a user's request, after start of use of the magnetic sensor module 10.

First, in S10, the magnetic sensor module 10 measures AC magnetic fields. For example, the AC magnetic field generation circuit 206 applies the AC calibration current from the constant current source to the first coil 210 and the second coil 220. Thereby, the first coil 210 and the second coil 220 generate AC calibration magnetic fields. The first magnetic sensor 110 having the X-axis as a magnetic sensing axis and the second magnetic sensor 120 having the Y-axis as a magnetic sensing axis output, to the voltage amplifier 320, an X-output voltage corresponding to the detected X direction magnetic field and a Y-output voltage corresponding to the detected Y direction magnetic field.

The voltage amplifier 320 amplifies the X-output voltage and Y-output voltage, and outputs the amplified X-output voltage and Y-output voltage to the AD converter 330. The AD converter 330 converts the X-output voltage and Y-output voltage, which are analog signals from the voltage amplifier 320, into digital values and supplies the same to the demodulation circuit 340. The demodulation circuit 340 converts the X-output voltage and Y-output voltage, which are digital AC signals, into DC signals, and sets the same as an initial sensitivity in the X direction and an initial sensitivity in the Y direction.

Also, the AC magnetic field generation circuit 206 applies the AC calibration current from the constant current source to the third coil 230. Thereby, the third coil 230 generates an AC calibration magnetic field. The third magnetic sensor 130 having the Z-axis as a magnetic sensing axis outputs a Z-output voltage corresponding to the detected Z direction magnetic field to the voltage amplifier 320.

The voltage amplifier 320 amplifies the Z-output voltage, and outputs the amplified Z-output voltage to the AD converter 330. The AD converter 330 converts the Z-output voltage, which is an analog signal from the voltage amplifier 320, into a digital value and supplies the same to the demodulation circuit 340. The demodulation circuit 340 converts the Z-output voltage, which is a digital AC signal, into a DC signal and sets the same as an initial sensitivity in the Z direction.

Then, in S20, the demodulation circuit 340 stores the initial sensitivities acquired in S10 in the memory 350.

In S30, the correction calculation circuit 360 reads out the initial sensitivities from the memory 350.

Then, in S40, the magnetic sensor module 10 measures AC magnetic fields. The magnetic sensor module 10 may measure the AC magnetic fields in a similar manner to S10, and acquire the obtained DC signals as current sensitivities. For example, the magnetic sensor module 10 may acquire the current sensitivities in the X direction, the Y direction and the Z direction.

Then, in S50, the correction calculation circuit 360 performs the sensitivity correction. For example, the correction calculation circuit 360 compares the initial sensitivities read in S30 and the current sensitivities obtained in S40, and determines sensitivity correction amounts. For example, the correction calculation circuit 360 may acquire, as the sensitivity correction amount, (initial sensitivity)/(current sensitivity) or (initial sensitivity)-(current sensitivity). The correction calculation circuit 360 may acquire the sensitivity correction amount in each of the X direction, the Y direction and the Z direction.

Then, in S60, the magnetic sensor module 10 measures external magnetic fields. For example, the magnetic sensor module 10 stops the operation of the AC magnetic field generation circuit 206, and causes the magnetic sensor chip 100 to measure the external magnetic fields. For example, the first magnetic sensor 110, the second magnetic sensor 120, and the third magnetic sensor 130 output the X-output voltage, the Y-output voltage, and the Z-output voltage to the voltage amplifier 320, respectively.

The voltage amplifier 320 amplifies each of the output voltages and outputs the same to the AD converter 330. The AD converter 330 converts the respective output voltages, which are analog signals from the voltage amplifier 320, into digital values, and supplies the same to the correction calculation circuit 360, as the external magnetic field measurement values in the X direction, the Y direction, and the Z direction.

Then, in S70, the correction calculation circuit 360 corrects a measurement result of the external magnetic fields obtained in S60 by the sensitivity correction amounts obtained in S50. For example, the correction calculation circuit 360 corrects each of the external magnetic field measurement values in the X direction, the Y direction and the Z direction by the sensitivity correction amounts in each of the X direction, the Y direction and the Z direction. As an example, the correction calculation circuit 360 executes the correction by multiplying or adding the sensitivity correction amounts in the corresponding directions by or to the external magnetic field measurement values in each of the directions.

In this way, according to the magnetic sensor module 10, it is possible to accurately correct the sensitivity of the magnetism measurement during the operation. In particular, the magnetic sensor module 10 of the present embodiment has such a configuration that the sensitivity adjusting coil covers each of the magnetic sensors or the entire magnetic sensor chip. Therefore, it is possible to apply the uniform magnetic field to each of the magnetic sensors.

Thereby, the magnetic sensor module 10 of the present embodiment can perform the sensitivity adjustment more accurately, as compared to the module of the related art. Also, according to the magnetic sensor module 10 of the present embodiment, since the sensitivity adjusting coil is not mounted in the magnetic sensor chip 100, it is possible to make the magnetic sensor chip 100 small and to save the cost.

In the meantime, for convenience of descriptions, in FIGS. 2, 3, 10, 11 and the like, the circuit of the signal processing unit 204 and the AC magnetic field generation circuit 206 included in the IC chip 200 are not shown. However, it should be noted that the IC chip 200 has the circuits and any other circuit in any positions, as required.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: magnetic sensor module
100: magnetic sensor chip

110: first magnetic sensor
111: region in direction of long side
120: second magnetic sensor
130: third magnetic sensor
131: region in direction of long side
140: pad
190: adhesive layer
200: IC chip
202: sensitivity adjusting unit
204: signal processing unit
206: AC magnetic field generation circuit
210: first coil
212: connection wire
214: intersection portion
220: second coil
222: intersection portion
230: third coil
232: intersection portion
240: first metal layer
250: second metal layer
260: pad
270: pad
280: first coil region
285: second coil region
300: conductive wire
320: voltage amplifier
330: AD converter
340: demodulation circuit
350: memory
360: correction calculation circuit

What is claimed is:

1. A magnetic sensor module comprising:
an IC chip having a first coil; and
a magnetic sensor chip that is disposed on a surface of the IC chip and includes a first magnetic sensor that detects magnetism in a direction of first axis, wherein
a planar shape of the IC chip encompasses a planar shape of the magnetic sensor chip,
the first coil has a planar shape including three or more sides,
the IC chip includes a second coil,
the magnetic sensor chip includes a second magnetic sensor that detects magnetism in a direction of second axis different from the first axis,
the second coil has a planar shape including three or more sides,
a vertical projection line from at least one side of the planar shape of the first coil to the first magnetic sensor traverses the first magnetic sensor in a direction different from the first axis and the second axis, and
the vertical projection line from the at least one side of the planar shape of the second coil to the second magnetic sensor traverses the second magnetic sensor in a direction different from the first axis and the second axis.

2. The magnetic sensor module according to claim 1, wherein
the first coil is, when seen in a cross section along at least one side of the planar shape of the IC chip, formed so as to cover a region, in a direction of the one side, of the first magnetic sensor.

3. The magnetic sensor module according to claim 1, wherein
the first coil is, when seen in a cross section along at least one side of the planar shape of the IC chip, formed so as to cover a region, in a direction of the one side, of the magnetic sensor chip.

4. The magnetic sensor module according to claim 1, wherein
a vertical projection line from at least one side of the planar shape of the first coil to the magnetic sensor chip traverses the magnetic sensor chip in a direction different from the first axis.

5. The magnetic sensor module according to claim 1, wherein
the second coil is, when seen in a cross section along at least one side of the planar shape of the IC chip, formed so as to cover a region, in a direction of the one side, of the second magnetic sensor.

6. The magnetic sensor module according to claim 5, wherein
the second coil is, when seen in the cross section along at least one side of the planar shape of the IC chip, formed so as to cover a region, in the direction of the one side, of the magnetic sensor chip.

7. The magnetic sensor module according to claim 1, wherein
a vertical projection line from at least one side of the planar shape of the second coil to the magnetic sensor chip traverses the magnetic sensor chip in a direction different from the second axis.

8. The magnetic sensor module according to claim 1, wherein
a vertical projection line from at least one side of the planar shape of the first coil to the magnetic sensor chip traverses the magnetic sensor chip in a direction different from the first axis and the second axis, and
the vertical projection line from the at least one side of the planar shape of the second coil to the magnetic sensor chip traverses the magnetic sensor chip in a direction different from the first axis and the second axis.

9. The magnetic sensor module according to claim 1, wherein
the first coil and the second coil are disposed so that a resultant magnetic field of a magnetic field generated from the first coil and a magnetic field generated from the second coil is generated in a direction parallel to the surface of the IC chip and different from the first axis and the second axis.

10. A magnetic sensor module comprising:
an IC chip having a first coil; and
a magnetic sensor chip that is disposed on a surface of the IC chip and includes a first magnetic sensor that detects magnetism in a direction of first axis, wherein a planar shape of the IC chip encompasses a planar shape of the magnetic sensor chip,
the first coil has a planar shape including three or more sides,
the IC chip includes a second coil,
the magnetic sensor chip includes a second magnetic sensor that detects magnetism in a direction of second axis different from the first axis,
the second coil has a planar shape including three or more sides,
the IC chip includes a third coil,
the magnetic sensor chip includes a third magnetic sensor that detects magnetism in a direction of third axis orthogonal to the first axis and the second axis,
the third coil has a planar shape including three or more sides, and
a vertical projection of the third coil to the magnetic sensor chip includes an entire region of the third magnetic sensor.

11. The magnetic sensor module according to claim 10, wherein
the vertical projection of the third coil to the magnetic sensor chip includes an entire region of the magnetic sensor chip.

12. The magnetic sensor module according to claim 10, wherein
the first magnetic sensor, the second magnetic sensor, and the third magnetic sensor each includes a magneto-resistive element configuring a Wheatstone bridge circuit.

13. The magnetic sensor module according to claim 10, wherein
the first magnetic sensor and the second magnetic sensor are disposed so as to overlap at least partially positions in a vertical direction in which magnetic fields generated by the first coil and the second coil are greatest.

14. The magnetic sensor module according to claim 13, wherein
the first magnetic sensor and the second magnetic sensor are disposed in positions in which the magnetic fields are greatest, in a direction passing a center of a line segment connecting a center of gravity of the first coil and a center of gravity of the second coil and perpendicular to the line segment.

15. The magnetic sensor module according to claim 10, wherein
the magnetic sensor chip includes a pad connected to the first magnetic sensor, a pad connected to the second magnetic sensor, and a pad connected to the third magnetic sensor.

16. The magnetic sensor module according to claim 10, wherein
the first coil is, when seen in a cross section along at least one side of the planar shape of the IC chip, formed so as to cover a region, in a direction of the one side, of the first magnetic sensor.

17. The magnetic sensor module according to claim 10, wherein
the first coil is, when seen in a cross section along at least one side of the planar shape of the IC chip, formed so as to cover a region, in a direction of the one side, of the magnetic sensor chip.

18. The magnetic sensor module according to claim 10, wherein
the second coil is, when seen in a cross section along at least one side of the planar shape of the IC chip, formed so as to cover a region, in a direction of the one side, of the second magnetic sensor.

19. The magnetic sensor module according to claim 18, wherein
the second coil is, when seen in the cross section along at least one side of the planar shape of the IC chip, formed so as to cover a region, in the direction of the one side, of the magnetic sensor chip.

20. An IC chip comprising:
a surface on which a magnetic sensor chip including a first magnetic sensor that detects magnetism in a direction of first axis is disposed;
a first coil;
a second coil; and
a third coil, wherein
a planar shape of the IC chip encompasses a planar shape of the magnetic sensor chip,
the first coil has a planar shape including three or more sides, and is, when seen in a cross section along at least one side of the planar shape, formed so as to cover a region, in a direction of the one side, of the first magnetic sensor,
the magnetic sensor chip includes a second magnetic sensor that detects magnetism in a direction of second axis,
the second coil has a planar shape including three or more sides, and is, when seen in a cross section along at least one side of the planar shape, formed so as to cover a region, in a direction of the one side, of the second magnetic sensor,
the magnetic sensor chip includes a third magnetic sensor that detects magnetism in a direction of third axis,
the third coil has a planar shape including three or more sides, and
a vertical projection of the third coil to the magnetic sensor chip includes an entire region of the third magnetic sensor.

21. The IC chip according to claim 20, wherein
the first coil is, when seen in a cross section along at least one side of the planar shape, formed so as to cover a region, in the direction of the one side, of the magnetic sensor chip.

22. The IC chip according to claim 20, wherein
the second coil is, when seen in a cross section along at least one side of the planar shape, formed so as to cover a region, in the direction of the one side, of the magnetic sensor chip.

23. The IC chip according to claim 20, wherein
the vertical projection of the third coil to the magnetic sensor chip includes an entire region of the magnetic sensor chip.

* * * * *